(12) United States Patent
Narwankar et al.

(10) Patent No.: US 6,475,854 B2
(45) Date of Patent: Nov. 5, 2002

(54) METHOD OF FORMING METAL ELECTRODES

(75) Inventors: Pravin K. Narwankar, Sunnyvale; Annabel Nickles, Palo Alto; Xiaoliang Jin, San Jose; Deepak Upadhyaya; Yaxin Wang, both of Fremont, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/748,072

(22) Filed: Dec. 21, 2000

(65) Prior Publication Data

US 2001/0043453 A1 Nov. 22, 2001

Related U.S. Application Data

(60) Provisional application No. 60/173,928, filed on Dec. 30, 1999.

(51) Int. Cl.[7] .......................................... H01L 21/8242
(52) U.S. Cl. ........................ 438/238; 438/240; 438/3; 438/396; 257/306; 257/310
(58) Field of Search .............................. 438/3, 240, 253, 438/396; 257/306, 310

(56) References Cited

U.S. PATENT DOCUMENTS

| | | | | |
|---|---|---|---|---|
| 5,122,923 A | | 6/1992 | Matsubara et al. | 361/321 |
| 5,335,138 A | | 8/1994 | Sandhu et al. | 361/303 |
| 5,814,852 A | | 9/1998 | Sandhu et al. | 257/310 |
| 5,834,357 A | * | 11/1998 | Kang | 438/240 |
| 5,838,035 A | | 11/1998 | Ramesh | 257/295 |
| 5,851,896 A | | 12/1998 | Summerfelt | 438/396 |
| 5,936,831 A | | 8/1999 | Kola et al. | 361/303 |
| 6,078,493 A | * | 6/2000 | Kang | 257/308 |
| 6,090,697 A | * | 7/2000 | Xing et al. | 438/618 |
| 6,165,834 A | * | 12/2000 | Agarwal et al. | 257/295 |
| 6,235,572 B1 | * | 5/2001 | Kunitomo et al. | 438/240 |
| 6,255,698 B1 | * | 7/2001 | Gardner et al. | 257/369 |
| 6,271,085 B1 | * | 8/2001 | Yamamoto | 438/253 |
| 6,291,290 B1 | * | 9/2001 | Arita | 438/240 |
| 6,294,425 B1 | * | 9/2001 | Hideki | 257/306 |
| 6,303,426 B1 | * | 10/2001 | Alers | 438/240 |
| 6,355,492 B1 | * | 3/2002 | Tanaka et al. | 438/240 |
| 2002/0022334 A1 | * | 2/2002 | Yang et al. | 438/396 |

* cited by examiner

Primary Examiner—John F. Niebling
Assistant Examiner—Jennifer M. Kennedy
(74) Attorney, Agent, or Firm—Moser, Patterson & Sheridan LLP

(57) ABSTRACT

A capacitor structure comprising a bottom electrode, an insulator and a top electrode, and method for manufacturing the same. The bottom and top electrodes preferably include a metal portion and a conducting oxygen-containing metal portion. In one embodiment, a layer of ruthenium is deposited to form a portion of the bottom electrode. Prior to deposition of the insulator, the ruthenium is annealed in an oxygen-containing environment. The insulator is then deposited on the oxygen-containing ruthenium layer. Formation of the top electrode includes depositing a first metal on the insulator, annealing the first metal and then depositing a second metal. The first and second metals may be ruthenium.

27 Claims, 11 Drawing Sheets

METHOD OF FORMING METAL ELECTRODES

CROSS-REFERENCE TO RELATED APPLICATIONS

This application claims benefit of priority to U.S. provisional application Ser. No. 60/173,928, entitled "Oxidation Annealing of Metal Electrodes", filed on Dec. 30, 1999, which is incorporated herein by reference in its entirety.

BACKGROUND OF THE INVENTION

1. Field of the Invention

The invention relates to a method, apparatus and article of manufacture for semiconductor processing.

2. Background of the Invention

Advancements in semiconductor manufacture have led to increases in the density and miniaturization of microelectronic devices. In general, as the integration of semiconductor devices such as a dynamic random access memory (DRAM) increases, the area available for the capacitor becomes more limited.

In order to obtain capacitors having a capacitance suitably large enough for a highly integrated device, new materials and structures for capacitors are being sought. One common capacitor structure includes a metal (M), insulator (I), silicon (S) stack, known as MIS, where the metal is a top electrode and the silicon is a bottom electrode. A typical insulator is $Ta_2O_5$ because of its high dielectric constant. More recently, capacitor stacks comprise metal (M), insulator (I) and metal (M) layers. Such a scheme is known as an MIM stack wherein both electrodes are metals.

One problem with using a metal as the bottom electrode is the potential for its oxidation during its fabrication. It is believed that oxidation of the bottom electrode occurs during deposition of an oxygen-containing material such as $Ta_2O_5$ and/or during an annealing step such as the annealing of $Ta_2O_5$. Oxidation of the bottom electrode changes the electrical properties of the capacitor and inhibits the ability of the capacitor to function properly. In particular, the dielectric constant of the insulator may be decreased, thereby detrimentally affecting the capacitance of the capacitor. The change in the dielectric constant of the insulator is believed to be due to migration of oxygen from the insulator to the metal electrode. The detrimental effects of oxidation of one or both of the electrodes can be quantified by the resulting high leakage currents and low breakdown voltages of the capacitors.

Therefore, there is a need for an improved capacitor structure and method for producing the same.

SUMMARY OF THE INVENTION

The present invention generally relates to a semiconductor device, and more particularly, to a capacitor structure of a semiconductor device and a method of manufacturing the same, which has a suitable capacitance for use in an integrated device.

According to one aspect of the invention, a semiconductor device comprises a bottom metal layer, an insulating layer, a top metal layer and conducting oxygen-containing layers at the interfaces of the metal layers and the insulating layer. In one embodiment, the top and bottom electrodes are made of ruthenium and the conducting oxygen-containing layer is ruthenium oxide.

In another aspect of the invention, a method for forming a device on a substrate is provided. In one embodiment, the method comprises forming a first metal layer on the substrate; forming a first conducting oxygen-containing layer on the first metal layer; forming an insulator on the first conducting oxygen-containing layer; forming a second conducting oxygen-containing layer on the insulator and forming a second metal layer on the second conducting oxygen-containing layer. In another embodiment the method comprises depositing a first ruthenium layer on a substrate; heating the substrate; contacting the first ruthenium layer with an oxygen-containing gas; depositing an insulating material thereafter; depositing a second ruthenium layer on the insulating material, contacting the second ruthenium layer with an oxygen-containing gas and then depositing a third metal layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides a capacitor structure and method for manufacturing the same. A capacitor includes a bottom electrode, an insulator and a top electrode. The bottom and top electrodes preferably include a metal portion and a conducting oxygen-containing metal portion. In one embodiment, a layer of ruthenium is deposited to form a portion of the bottom electrode. Prior to deposition of the insulator, the ruthenium is treated or annealed in an oxygen-containing environment to form a conductive oxygen-containing ruthenium layer. The insulator is then deposited on the oxygen-containing ruthenium layer. Formation of the top electrode includes depositing a first metal layer on the insulator, annealing the first metal layer and then depositing a second metal layer. For example, the first and second metals may be ruthenium. Alternatively, the top electrode may also be formed from a single conductive layer.

Apparatus

Figure 1:
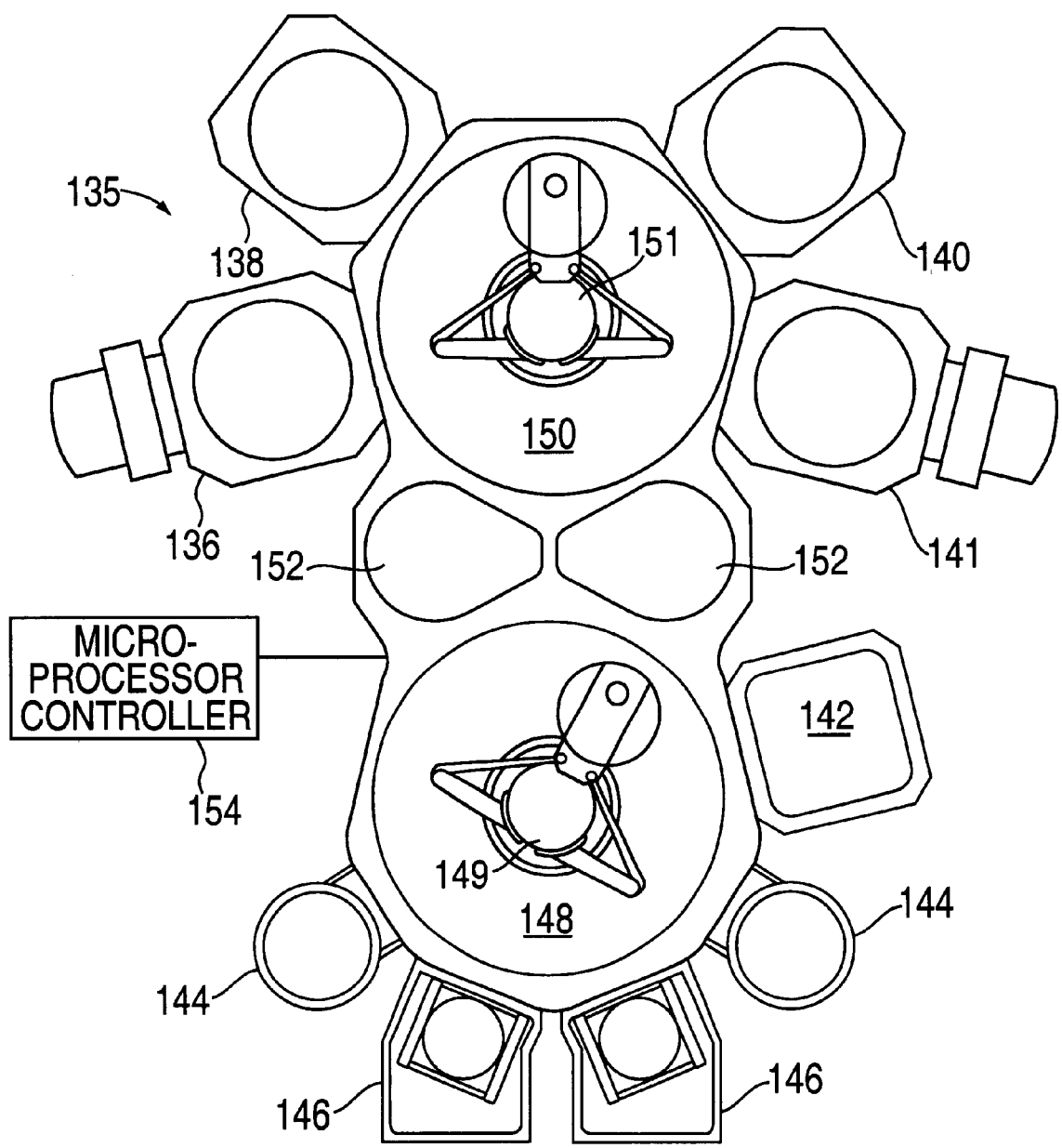
FIG. 1 is a schematic illustration of an apparatus that can be used for practicing embodiments of the invention.

Embodiments of the invention can be performed using a variety of processing systems suitable for integrated circuit fabrication. FIG. 1 is a schematic representation of a wafer processing system 135 that can be used to perform integrated circuit fabrication in accordance with embodiments described herein. The wafer processing system 135 typically comprises process chambers 136, 138, 140, 141, degas chambers 144, load-lock chambers 146, transfer chambers 148, 150, pass-through chambers 152, a microprocessor controller 154, along with other hardware components such as power supplies (not shown) and vacuum pumps (not shown). An example of such a wafer processing system 135 is an ENDURA® System, commercially available from Applied Materials, Inc., Santa Clara, Calif.

Details of the wafer processing system 135 are described in commonly assigned U.S. Pat. No. 5,186,718, entitled "Staged-Vacuum Substrate Processing System and Method," issued on Feb. 16, 1993, which is incorporated herein by reference in its entirety. The salient features of the wafer processing system 135 are briefly described below.

The wafer processing system 135 includes two transfer chambers 148, 150 each containing a transfer robot 149, 151. The transfer chambers 148, 150 are separated one from the other by pass-through chambers 152.

The transfer chamber 148 is coupled to load-lock chambers 146, degas chambers 144, pre-clean chamber 142, and pass-through chambers 152. Substrates (not shown) are loaded into the wafer processing system 135 through load-lock chambers 146. Thereafter, the substrates are sequentially degassed and cleaned in degas chambers 144 and the pre-clean chamber 142, respectively. The transfer robot 148 moves the substrates between the degas chambers 144 and the pre-clean chamber 142.

Transfer chamber 150 is coupled to a cluster of process chambers 136, 138, 140, 141. The cleaned substrates are moved from transfer chamber 148 into transfer chamber 150 via pass-through chambers 152. Thereafter, transfer robot 151 moves the substrates between one or more of the process chambers 136, 138, 140, 141.

The process chambers 136, 138, 140, 141 are used to perform various integrated circuit fabrication sequences. For example, process chambers 136, 138, 140, 141 may include physical vapor deposition (PVD) chambers, ionized metal plasma physical vapor deposition (IMP PVD) chambers, chemical vapor deposition (CVD) chambers, rapid thermal processing (RTP) chambers and anti-reflective coating (ARC) chambers, among others.

Figure 2:
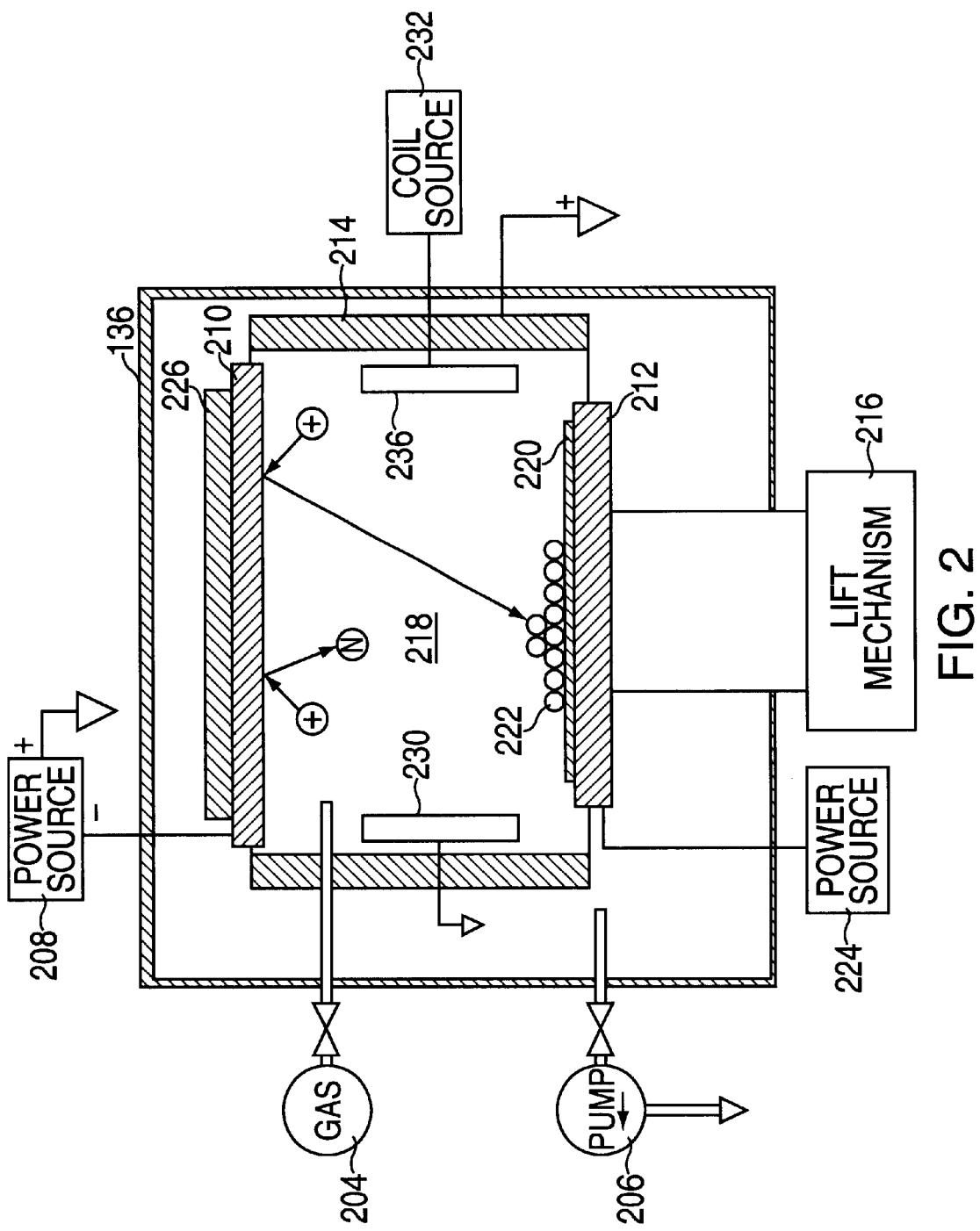
FIG. 2 is a schematic cross-sectional view of a sputtering type physical vapor deposition chamber.

FIG. 2 is a schematic cross-sectional view of a sputtering-type PVD process chamber 136 of wafer processing system 135. An example of such a PVD process chamber 136 is an IMP VECTRA™ chamber, which is commercially available from Applied Materials, Inc., Santa Clara, Calif.

The PVD chamber 136 is coupled to a gas source 204, a pump system 206 and a target power source 208. The PVD chamber 136 encloses a target 210, a substrate 220 positioned on a vertically movable pedestal 212, and a shield 214 enclosing a reaction zone 218. A lift mechanism 216 is coupled to the pedestal 212 to position the pedestal 212 relative to the target 210.

The gas source 204 supplies a process gas into the PVD chamber 136. The process gas generally includes argon (Ar) or some other inert gas. The pump system 206 controls the pressure within the PVD chamber 136.

The target 210 is typically suspended from the top of the PVD chamber 136. The target 210 includes a material that is sputtered during operation of the wafer processing system 135. Although the target 210 may comprise, as a material to be deposited, an insulator or semiconductor, the target 210 generally comprises a metal. For example, the target 210 may be formed of ruthenium (Ru), copper (Cu), titanium (Ti), tantalum (Ta), and combinations thereof as well as other materials known in the art.

The pedestal 212, which supports the substrate 220 within the PVD chamber 136, is generally disposed at a fixed distance from the target 210 during processing. However, the distance between the target 210 and the substrate 220 may also be varied during processing. The pedestal 212 is supported by the lift mechanism 216, which moves the pedestal along a range of vertical motion within the PVD chamber 136.

The target power source 208 is used to infuse the process gas with energy and may comprise a DC source, a radio frequency (RF) source, or a DC-pulsed source.

Applying either DC or RF power to the process gas creates an electric field in the reaction zone 218. The electric field ionizes the process gas in the reaction zone 218 to form a plasma comprising process gas ions, electrons, and process gas atoms (neutrals). Additionally, the electric field accelerates the process gas ions toward the target 210, for sputtering target particles from the target 210. When electrons in the plasma collide with the sputtered target particles, such target particles become ionized.

The process chamber 136 configuration enables deposition of sputtered and ionized target particles from the target 210 onto the substrate 220 to form a film 222 thereon. The shield 214 confines the sputtered particles and non-reactant gas in a reaction zone within the process chamber 136. As such, the shield 214 prevents deposition of target particles in unwanted locations, for example, beneath the pedestal 212 or behind the target 210.

The process chamber 136 may comprise additional components for improving the deposition of sputtered particles onto the substrate 220. For example, the process chamber 136 may include a bias power source 224 for biasing the substrate 220. The bias power source 224 is coupled to the pedestal 212 for controlling material layer deposition onto the substrate 220. The bias power source 224 is typically an AC source having a frequency of, for example, about 400 kHz.

When the bias power from the power source 224 is applied to the substrate 220, electrons in the plasma accumulate to the substrate 220, creating a negative DC offset on the substrate 220 and the pedestal 212. The bias power applied to the substrate 220 attracts sputtered target particles that become ionized. These ionized target particles are generally attracted to the substrate 220 in a direction that is substantially perpendicular thereto. As such, the bias power source 224 enhances the deposition of target particles onto the substrate 220.

The process chamber 136 may also comprise a magnet 226 or magnetic sub-assembly positioned behind the target 210 for creating a magnetic field proximate to the target 210. In addition, the process chamber 136 may comprise a coil 230 disposed within the shield 214 between the target 210 and the substrate 220. The coil 230 may comprise either a single-turn coil or a multi-turn coil that, when energized, ionizes the sputtered particles. This process is known as Ion Metal Plasma (IMP) deposition. The coil 230 is generally coupled to an AC source 232 having a frequency of, for example, about 2 MHz.

Figure 3:
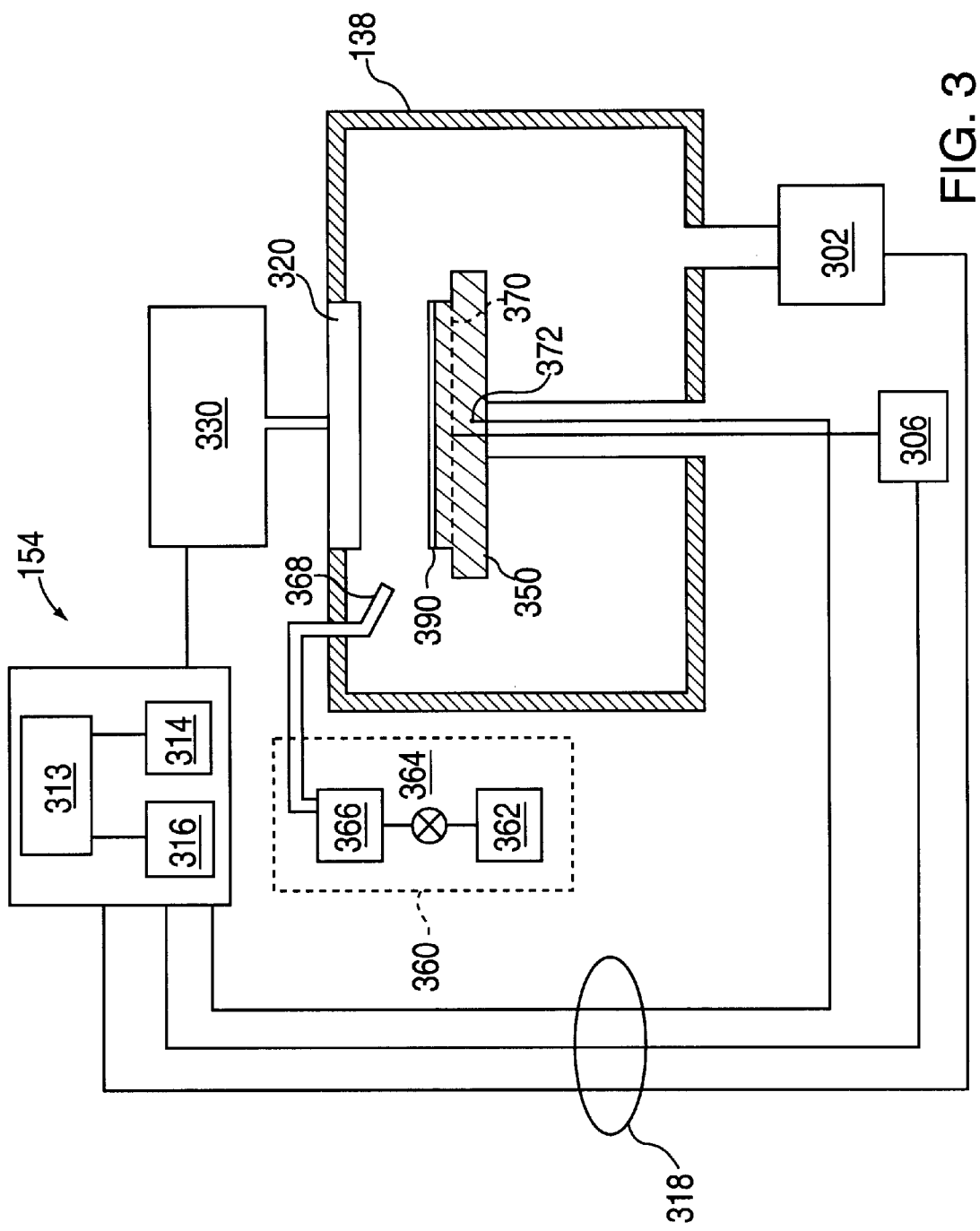
FIG. 3 is a schematic cross-sectional view of a chemical vapor deposition chamber.

FIG. 3 depicts a schematic cross-sectional view of a chemical vapor deposition (CVD) process chamber 138 of the wafer processing system 135. Examples of such CVD process chambers 136 include TXZ™ chambers, WXZ™ chambers, and DXZ™ chambers, which are commercially available from Applied Materials, Inc., Santa Clara, Calif.

The CVD process chamber 138 generally houses a wafer support pedestal 350, which is used to support a substrate 390. The wafer support pedestal 350 can typically be moved in a vertical direction inside the CVD process chamber 138 using a displacement mechanism (not shown). Depending on the specific CVD process, the substrate 390 can be heated to some desired temperature prior to or during deposition. For example, the wafer support pedestal 350 is heated by an embedded heater element 370. The wafer support pedestal 350 may be resistively heated by applying an electric current from an AC power supply 306 to the heater element 370. The substrate 390 is, in turn, heated by the pedestal 350.

A temperature sensor 372, such as a thermocouple, is also embedded in the wafer support pedestal 350 to monitor the temperature of the pedestal 350 in a conventional manner. The measured temperature is used in a feedback loop to control the AC power supply 306 for the heating element 370, such that the substrate temperature can be maintained or controlled at a desired A5 temperature which is suitable for the particular process application. The wafer support pedestal 350 is optionally heated using radiant heat (not shown).

A vacuum pump 302 is used to evacuate the CVD process chamber 138 and to maintain the proper gas flows and pressures inside such chamber 138. A showerhead 320, through which process gases are introduced into the chamber 138, is located above the wafer support pedestal 350. The showerhead 320 is connected to a gas panel 330, that controls and supplies various gases provided to the chamber 138.

Proper control and regulation of the gas flows through the gas panel 330 is performed by mass flow controllers (not shown) and a microprocessor controller 154 (FIG. 1). The showerhead 320 allows process gases from the gas panel 330 to be uniformly introduced and distributed in the CVD process chamber 138.

The CVD process chamber 138 may comprise additional components for enhancing layer deposition on the substrate 390. For example, the showerhead 320 and wafer support pedestal 350 may also form a pair of spaced apart electrodes. When an electric field is generated between these electrodes, the process gases introduced into the chamber 138 are ignited to form a plasma.

Typically, the electric field is generated by coupling the wafer support pedestal 350 to a source of radio frequency (RF) power (not shown) through a matching network (not shown). Alternatively, the RF power source and matching network may be coupled to the showerhead 320, or coupled to both the showerhead 320 and the wafer support pedestal 350.

Plasma enhanced chemical vapor deposition (PECVD) techniques promote excitation and/or dissociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Referring to FIG. 1, both the PVD process chamber 136 and the CVD process chamber 138, as described above, are controlled by a microprocessor controller 154. The microprocessor controller 154 may be one of any form of general purpose computer processor that can be used in an industrial setting for controlling various chambers and sub-processors.

The computer processor may use any suitable memory, such as random access memory, read only memory, floppy disk drive, hard disk, or other form of digital storage, local or remote. Various support circuits may be coupled to the microprocessor controller 154 for supporting the processor in a conventional manner. Software routines as required may be stored in the memory or executed by a second microprocessor controller that is remotely located.

The software routines are executed after the substrate is positioned in one of the process chambers 136, 138, 140, 141. The software routine, when executed, transforms the general purpose computer into a specific process computer that controls the chamber operation so that the deposition process is performed. Alternatively, the embodiments described herein may be performed in hardware, as an application specific integrated circuit or other type of hardware implementation, or a combination of software and hardware.

For example, the microprocessor controller 154 may comprise a central processor unit (CPU) 312, support circuitry 314, and memories 316 containing associated control software, as shown in FIG. 3. The microprocessor controller 154 is used for automated control of the numerous steps required for wafer processing - such as wafer transport, gas flow control, temperature control, chamber evacuation, and so on. Bi-directional communications between the microprocessor controller 154 and various components of the wafer processing system 135, e.g., the CVD process chamber 138, are handled through numerous signal cables collectively referred to as signal buses 318, some of which are illustrated in FIG. 3.

Optionally, a remote plasma source 360 may be coupled to the CVD process chamber 138, as shown in FIG. 3, to provide a remotely generated plasma to the CVD process chamber 138. The remote plasma source 360 includes a gas supply 362, a gas flow controller 364, a plasma chamber 366, and a chamber inlet 368. The gas flow controller 364 controls the flow of process gas from the gas supply 362 to the plasma chamber 366.

A remote plasma may be generated by applying an electric field to the process gas in the plasma chamber 366, creating a plasma of reactive species. Typically, the electric field is generated in the plasma chamber 151 using a RF power source (not shown). The reactive species generated in the remote plasma source 360 are introduced into the CVD process chamber 138 through inlet 368. An example of a remote plasma source has been disclosed in U.S. Pat. No. 5,844,195, entitled "Remote Plasma Source", issued on Dec. 1, 1998, which is incorporated herein by reference in its entirety.

Figure 4:
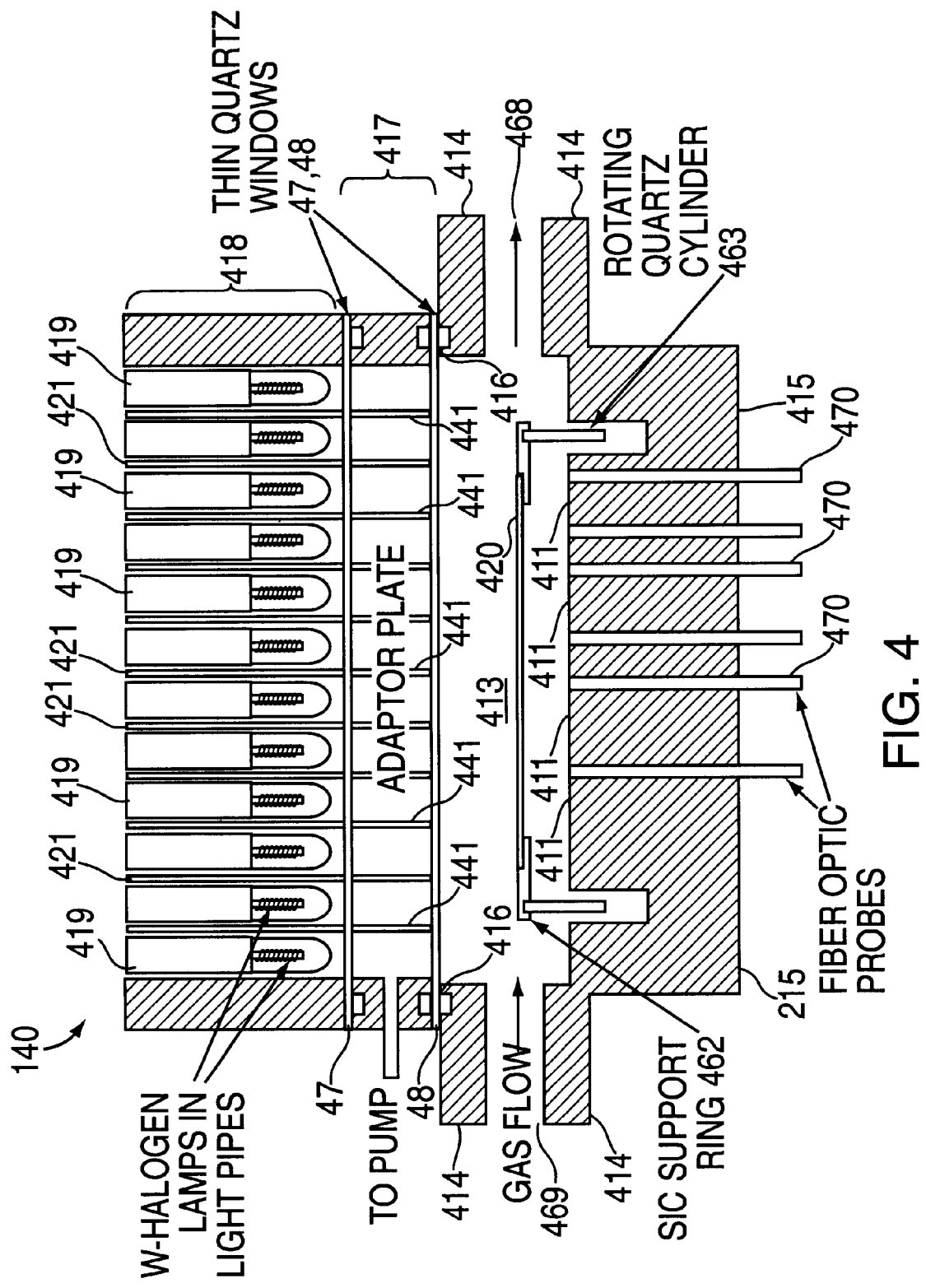
FIG. 4 is a schematic cross-sectional view of a remote thermal processing chamber.

FIG. 4 depicts a schematic cross-sectional view of a rapid thermal processing (RTP) chamber 140 of the wafer processing system 135. An example of a RTP chamber 140 is a CENTURA® chamber, which is commercially available from Applied Materials, Inc., Santa Clara, Calif.

The RTP chamber 140 includes sidewalls 414, a bottom 415, and a window assembly 417. The sidewalls 414 and the bottom 415 generally comprise a metal such as stainless steel. The upper portions of sidewalls 414 are sealed to the window assembly 417 by O-rings 416. A radiant energy assembly 418 is positioned over and coupled to the window assembly 417. The radiant energy assembly 418 includes a plurality of lamps 419 each mounted to a light pipe 421.

The RTP chamber 140 houses a substrate 420 supported around its perimeter by a support ring 462 made of, for example, silicon carbide. The support ring 462 is mounted on a rotatable cylinder 463. The rotatable cylinder 463 causes the support ring 462 and the substrate 420 to rotate within the RTP chamber 140.

The bottom 415 of the chamber 140 includes a gold-coated top surface 411, which reflects light energy onto the backside of the substrate 420. Additionally, the RTP chamber 140 includes a plurality of temperature probes 470 positioned through the bottom 415 of the RTP chamber 140 to detect the temperature of the substrate 420.

A gas inlet 469 through the sidewall 414 provides process gases to the RTP chamber 140. A gas outlet 468 positioned through the sidewall 414 opposite to a gas inlet 469 removes process gases from the RTP chamber 140. The gas outlet 468 is coupled to a pump system (not shown) such as a vacuum source. The pump system exhausts process gases from the RTP chamber 140 and maintains a desired pressure therein during processing.

The radiant energy assembly 418 preferably is configured so the lamps 419 are positioned in a hexagonal array or in a "honeycomb" arrangement, above the surface area of the substrate 420 and the support ring 462. The lamps 419 are grouped in zones that may be independently controlled to uniformly heat the substrate 220.

The window assembly 417 includes a plurality of short light pipes 441 that are registered to the light pipes 421 of the radiant energy assembly 418. Radiant energy from the lamps 421 is provided via light pipes 421, 441 to the process region 413 of the RTP chamber 140.

Process

Figure 5:
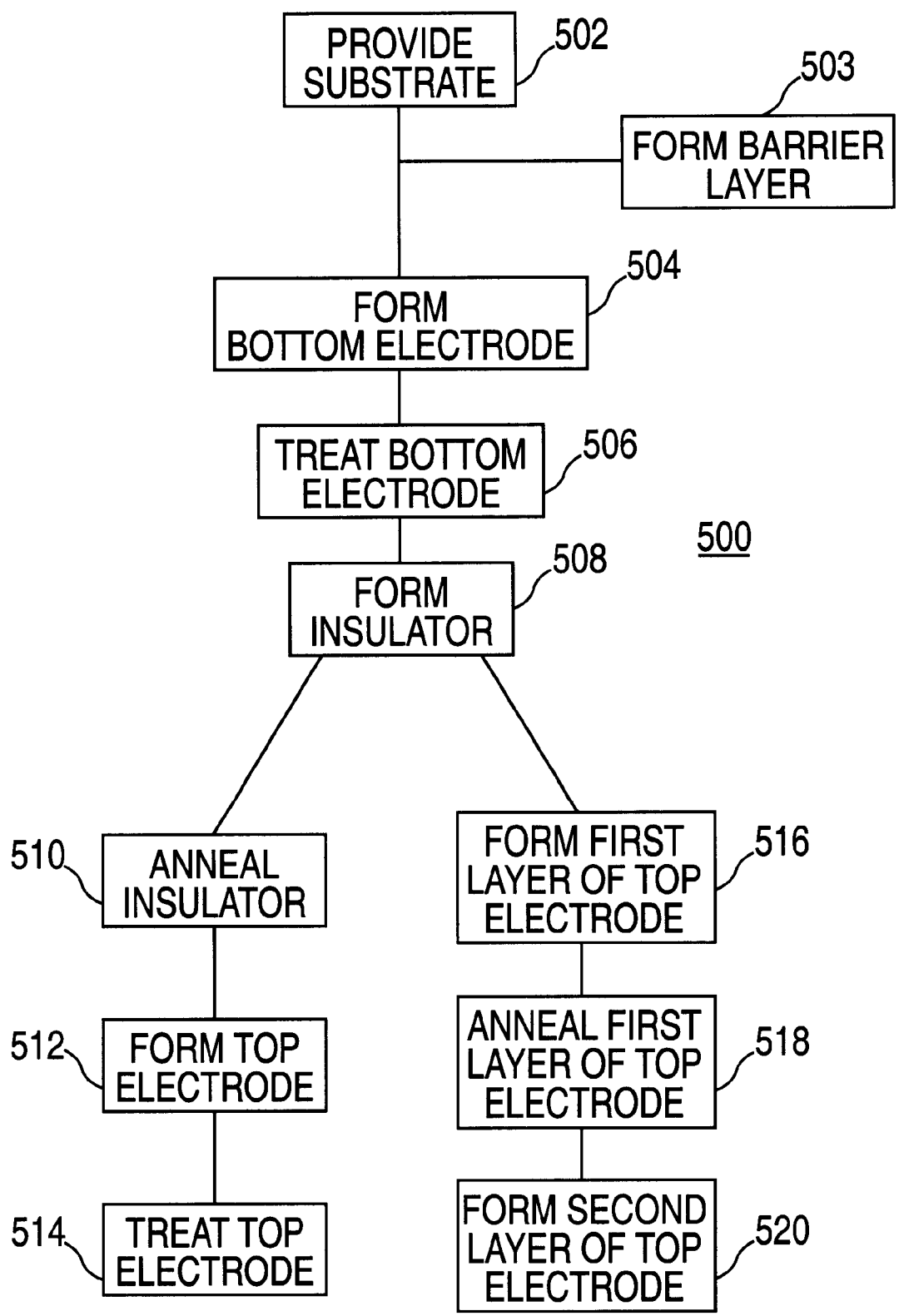
FIG. 5 is a flow diagram of a method for forming a capacitor.

FIG. 5 is a flow diagram showing a method 500 of the invention for forming a capacitor. At step 502, a substrate is provided on which a capacitor may be formed. At step 504, a film is formed on the substrate to provide a portion of a bottom electrode of the capacitor. In one embodiment, a barrier layer may be formed on the substrate at step 503, prior to the formation of the portion of the bottom electrode at step 504. The barrier layer helps minimize undesirable material diffusion between the bottom electrode and the underlying substrate. At step 506, the surface of the film formed in step 504 is treated to complete the formation of the bottom electrode. The treatment results in an oxygen-containing layer for the bottom electrode.

At step 508, an insulator is formed over the bottom electrode. In one embodiment, the insulator is also subjected to an annealing step 510 in a plasma and/or thermal environment. At step 512, a top electrode is formed on the insulator. The top electrode thus formed may optionally be treated or annealed in a subsequent step 514. The treatment of the top electrode is performed in an oxygen-containing environment, under plasma and/or thermal conditions. The oxygen-containing environment may optionally include inert gases such as nitrogen ($N_2$), argon (Ar), and helium (He), among others.

In another embodiment, a top electrode is formed directly on the insulator from step 508, without subjecting the insulator to any treatment or annealing. For example, the top electrode may be formed directly on the insulator in several stages, as illustrated in steps 516, 518 and 520. At step 516, a first layer of the top electrode is formed. This is followed by step 518, in which the first layer of the top electrode is treated or annealed. For example, the treatment may be performed in an oxygen-containing environment. At step 520, a second layer of the top electrode is formed on the treated first layer, thus completing the formation of the top electrode. The second layer of the top electrode may optionally be treated using the process described above. The method 500 is merely illustrative and other steps or materials may be provided to manufacture the capacitor.

Layer Structure of a Capacitor

Figure 6A:
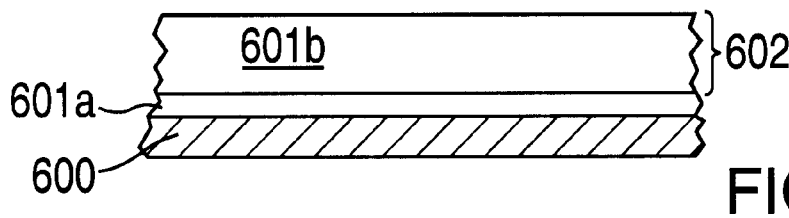
FIGS. 6a–f illustrate a layer structure for a capacitor.

One embodiment of a capacitor that may be manufactured according to embodiments of method 500 is illustrated in FIGS. 6a–g, which show partial sectional views of a substrate structure at various stages of processing. FIG. 6a shows a substrate 600 on which a capacitor may be formed. Depending on the specific stage of processing, the substrate 600 may correspond to a silicon wafer, or other material layer that has been formed on the silicon wafer.

FIG. 6a shows the substrate 600 having a lower metal layer 602 of a lower (or first) electrode formed thereon. Preferably, the lower metal layer 602 is ruthenium or a ruthenium-containing material. However, other metals such as iridium (Ir) or platinum (Pt) may also be used to form the lower metal layer 602 of the lower electrode. The lower metal layer 602 may be formed by a deposition method such as chemical vapor deposition (CVD), physical vapor deposition (PVD) and the like. Optionally, a barrier layer (not shown), e.g., a refractory metal layer such as TiN, TiAlN and TaN, among others, may be formed on the substrate 600, prior to the formation of the lower metal layer 602. The barrier layer preferably has a thickness of less than about 1000 Å.

In one embodiment, as shown in FIG. 6a the lower metal layer 602 is formed in different stages that involve, for example, depositing a relatively thin seed layer 601a prior to depositing the bulk metal layer 601b. CVD ruthenium (Ru) deposition via metalorganic chemical vapor deposition (MOCVD) precursors, e.g., ruthenium bis-(ethylcyclopentadienyl) (Ru $(EtCp)_2$) or ruthenium octanedionate (Ru$(OD)_3$), may optionally require a seed layer if the substrate is, among others, silicon (Si), silicon dioxide ($SiO_2$), silicon nitride (SiN), titanium nitride (TiN), titanium aluminum nitride (TAlN), tantalum nitride (TaN), tantalum pentoxide ($Ta_2O_5$), or barium strontium titanate (BST).

The seed layer 601a, which may be deposited either by PVD or CVD, may have a thickness less than about 100 Å. The seed layer 601a helps facilitate subsequent formation of the bulk metal layer 601b, and allows the lower metal layer 602 to be formed with enhanced film properties such as improved surface smoothness, and reduced haze. For example, a GIGA-CAP™ chamber, available from Applied Materials, Inc., is suitable for forming a ruthenium layer 602 using CVD. Details of one embodiment of forming the lower metal layer 602 by CVD have been disclosed in commonly assigned U.S. patent application Ser. No. 09/872,878, entitled "CVD Ruthenium Seed for CVD Ruthenium Deposition", filed on Apr. 5, 2001, which is incorporated herein by reference in its entirety.

In one embodiment, the ruthenium seed layer 601a is formed in an oxygen-rich environment, having an oxygen to ruthenium ratio ($O_2$:Ru) from about 10:1 to 100:1. Under this condition, a ruthenium seed layer 601a is formed with a relatively high oxygen content, which enhances nucleation on the substrate. For example, the ruthenium seed layer 601a may comprise $RuO_x$, where x may range from 0 to about 2. However, with a $RuO_2$ seed layer, subsequent ruthenium deposition by CVD would result in a $RuO_2$ bulk film, and not a ruthenium bulk film. Furthermore, the inventors have found that it is ineffective to attempt to form a ruthenium seed layer under a low oxygen content environment as the organo-based precursors do not form oxides in environments with low oxygen contents. Instead, raising the oxygen flow rate allows for effective seeding and formation of a $RuO_x$ seed layer 601a, where x is between 0 and about 2.

The thickness of the $RuO_x$ seed layer 601a, as controlled by deposition time, is found to have a significant effect in the subsequent CVD deposition of a Ru bulk layer. For example, a shorter seed deposiiton time (i.e., a thinner seed layer) tends to reduce the formation of haze on the ruthenium layer. On the other hand, a thicker seed layer may cause peeling between a subsequently deposited ruthenium bulk layer and the seed layer. Thus, the $RuO_x$ seed layer 601a may be formed to a thickness of less than about 200 Å.

After the $RuO_x$ seed layer 601a is formed, it is subjected to a treatment step in which the oxygen content of the $RuO_x$ seed layer 601a is reduced. Reduction of the oxygen content of the $RuO_x$ seed layer 601a is required in order to provide seeding for a subsequently deposited ruthenium layer. For example, the treatment of the $RuO_x$ seed layer 601a may be performed in a nitrogen-containing and hydrogen-containing environment, such as that generated from a gas mixture of nitrogen ($N_2$) and hydrogen ($H_2$). The treatment results in a reduction in the oxygen content of the RuO seed layer 601a, e.g., from about 60% to between about 10% and about 20%. Furthermore, the adhesion of the $RuO_x$ seed layer 601a to the substrate as well as surface smoothness and uniformity of the $RuO_x$ seed layer 601a are improved by annealing. After the $RuO_x$ seed layer 601a has been treated, the bulk ruthenium metal layer 601b may be formed by either CVD or PVD.

Figure 6B:
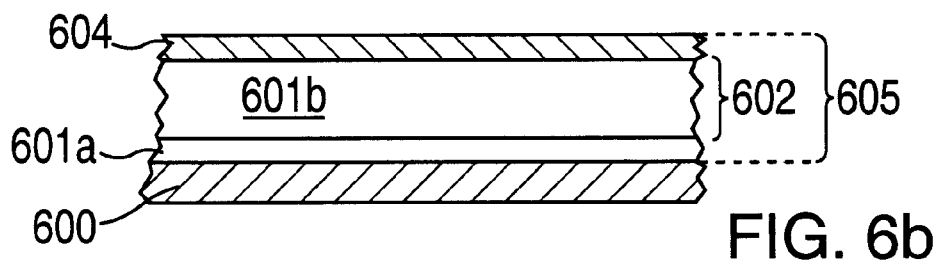

Subsequently, the lower metal layer 602 (comprising the seed layer 601a and the bulk layer 601b) is treated or annealed to form a lower oxygen-containing metal layer 604, as shown in FIG. 6b. In the case where the lower metal layer 602 is ruthenium, the lower oxygen-containing metal layer 604 may be ruthenium oxide, or more generally, an oxygen-containing ruthenium layer formed by oxygen incorporation in at least a portion of the lower ruthenium layer 602.

Treatment of the lower metal layer 602 is accomplished by positioning the substrate in a process chamber and exposing the lower metal layer 602 to an oxygen-containing ambient. Illustrative oxygen-containing ambients include active oxygen radical environments, $O_2$ environments, $N_2O$ environments and other combinations thereof. More generally, any oxygen-containing gas may be used. Further, the treatment ambient may also include other gases such as inert gases, e.g., argon (Ar), nitrogen ($N_2$), and helium (He), among others.

Treatment of the lower metal layer 602 is preferably performed in situ—i.e., in the same process system as used for metal deposition, without exposing the substrate to the atmosphere. In situ treatment is generally preferred because undesirable contamination can be avoided. The treatment of the lower metal layer 602 can generally be performed under different conditions including, for example, plasma and/or thermal annealing. For plasma treatment, a local plasma (also referred to as a "direct" plasma) or a remote plasma may be generated in a process chamber such as that shown in FIG. 3, while thermal annealing may be performed in a CVD chamber 138 equipped for thermal processing or a RTP chamber 140 such as that illustrated in FIG. 4.

An elevated temperature tends to facilitate the treatment process. In one embodiment, a substrate temperature between about 300° C. and 850° C. is used. For active oxygen radical environments, $O_2$ environments and $N_2O$ environments, the temperature may be between about 300° C. to 600° C., 700° C. to 850° C. and 400° C. to 750° C., respectively. The time duration of the anneal step depends on the particular oxygen-containing ambient. In one embodiment, the anneal time duration is between about 10 seconds and about 2 minutes. Although the lower oxygen-containing metal layer 204 is shown as a thin film formed on the lower metal layer 202, in another embodiment, the bulk of the lower electrode may be oxidized.

In general, the annealing environment may comprise an inert gas, or a gas mixture comprising an inert gas and oxygen, or even 100% oxygen. In one embodiment, annealing is achieved using a remote plasma generated from a gas mixture of Ar, $O_2$ and $N_2$ having a ratio of about 4:1:0.1. For example, the remote plasma is coupled to a xZ RPA chamber, which is a modified CVD chamber, and annealing is performed at a pressure of about 2.5 Torr and a temperature of about 450° C.

The lower oxygen-containing metal layer 604 and the lower metal layer 602 together form the lower electrode 605. In one embodiment, the lower electrode 606 has a thickness between about 100 Angstroms (Å) and about 2000 Å. In addition to ruthenium, other materials such as Ir or Pt may also be used for forming the lower electrode 605.

Figure 6C:
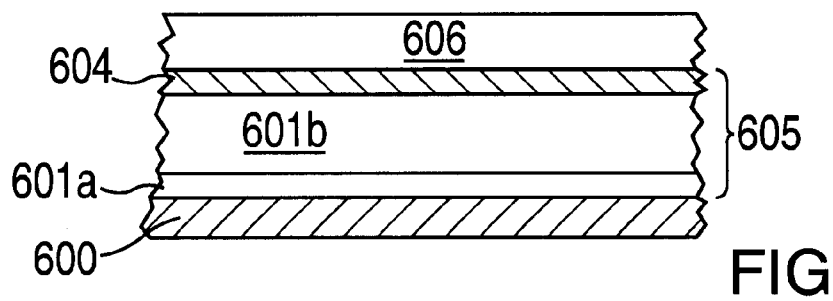

Subsequent to the formation of the lower oxygen-containing layer 604, an insulating layer 606 is formed, as shown in FIG. 6c. The insulating layer 606 is preferably a material having a high dielectric constant, e.g., greater than about 20. In general, high-K dielectrics comprising binary metal oxides and perovskite oxides may be used as the insulating layer 606, e.g., tantalum pentoxide ($Ta_2O_5$), barium strontium titanate (BST), lead zirconium titanate (PZT), strontium bismuth titanate (SBT), strontium ruthenium odixe (SRO), hafnium oxide (HfO), zinc oxide (ZnO), zirconium oxide (ZrO), and cerium oxide (CeO), among others. The thickness of the insulating layer 606 may range from about 50 Å to about 1000 Å.

In one embodiment, the insulating layer 606 is $Ta_2O_5$. In general, deposition of $Ta_2O_5$ may be accomplished using a combination of $O_2$ and penta-ethoxytantalum ($Ta(OC_2H_5)_5$) as a source of Ta. A thin film of $Ta_2O_5$ may be deposited using reactive sputtering, chemical vapor deposition (CVD), plasma-enhanced CVD (PECVD), or electron cyclotron resonance (ECR) processing and any other suitable process. The dielectric constant and leakage current of $Ta_2O_5$ may then be reduced by performing a heat treatment after forming the thin film.

The insulator may be annealed using a variety of process chambers including, for example, CVD, RTP, xZ RPA, or other suitable chambers equipped for local plasma or remote plasma operation. The annealing ambient may comprise an inert gas, or a mixture of inert gas and oxygen, or 100% oxygen, at a pressure from several Torr to about 1 atm. and a temperature between about 300° C. and about 800° C. The annealing time, which may vary according to specific needs or the thickness of the insulator, may range from several seconds, e.g., about 15 seconds, to several minutes, e.g., about 10 minutes.

To complete the formation of a capacitor, an upper electrode is formed on the insulator layer 606. According to embodiments of the invention, the formation of the upper electrode involves depositing a first upper metal layer 608, treating the first upper metal layer 608 to form an upper oxygen-containing layer 610 and then depositing a second upper metal layer 612. In one embodiment, the thickness of the upper electrode is between about 250 Å and about 2000 Å.

Figure 6D:
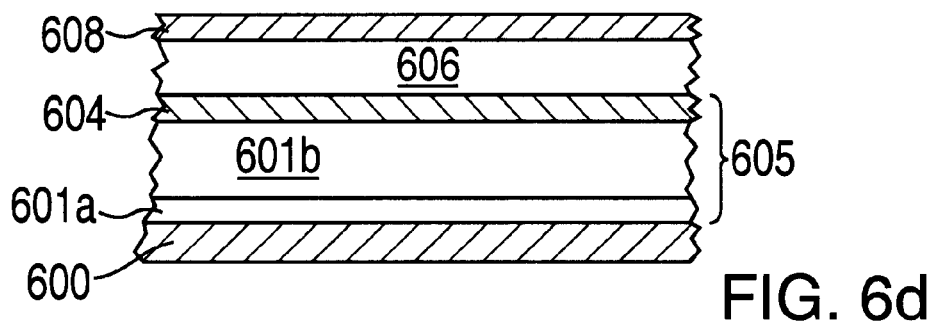

FIG. 6d shows a first upper metal layer 608 formed on the insulating layer 606. Preferably, the first upper metal layer 608 is ruthenium or a ruthenium-containing material. The processes used for forming the upper electrode are similar to those previously described for the lower electrode 605. For example, deposition of the first upper metal layer 608 may be performed by PVD or CVD, and its thickness may range from about 100 Å to about 1000 Å. Aside from ruthenium, materials such as Ir and Pt may also be used to form the first upper metal layer 608.

Figure 6E:
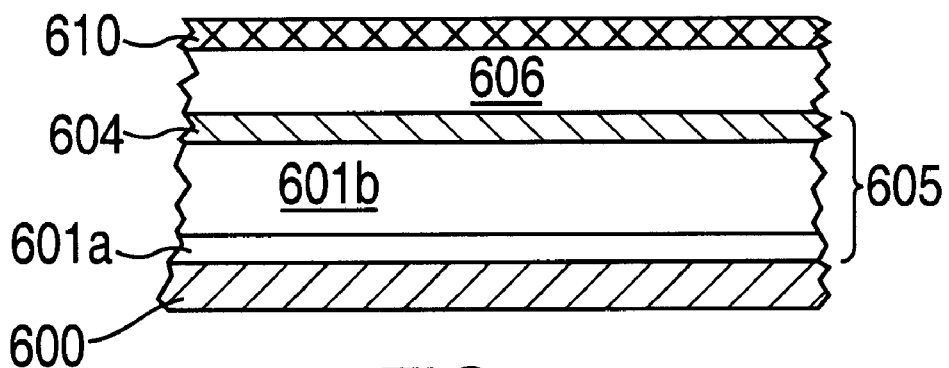

The first upper metal layer 608 is then treated or annealed in an oxygen-containing environment, resulting in the upper oxygen-containing layer 610, as shown in FIG. 6e. Treatment or annealing of the first upper metal layer 608 may be accomplished in a manner similar to that used in forming the lower oxygen-containing layer 604, e.g., by exposing the first upper metal layer 608 to an oxygen-containing gas while heating the substrate. Preferably, the first upper metal layer 608 is treated such that oxygen is present throughout the entire first upper metal layer 608. Accordingly, the resulting upper oxygen-containing layer 610 is substantially the same thickness as the first upper metal layer 608.

Figure 6F:
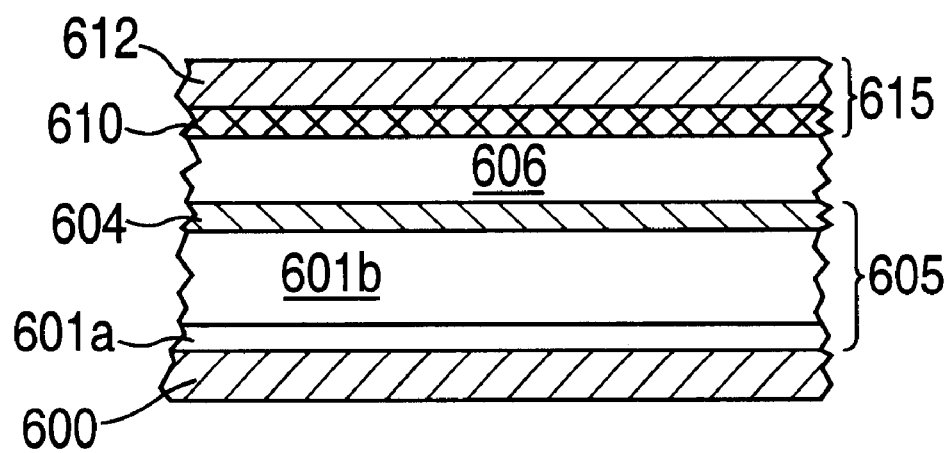

A second upper metal layer 612 is then deposited onto the upper oxygen-containing layer 610 to form a completed capacitor structure 650, as shown in FIG. 6f. The second upper metal layer 612 may be deposited in a manner similar to that described for the first upper metal layer 608. Preferably, the second upper metal layer 612 is the same material as the first upper metal layer 608, and preferably is ruthenium. However, Ir or Pt may also be used as the second upper metal layer 612. The second upper metal layer 612 may be formed by either CVD or PVD. Furthermore, the second upper metal layer 612 may be formed in different stages including, for example, the formation of a PVD or CVD seed layer (not shown) followed by a deposition of a bulk metal layer by CVD as previously described for the lower metal layer 602.

The second upper metal layer 612 may have a thickness ranging from about 200 Å to about 2000 Å. The upper oxygen-containing layer 610 and the second upper metal layer 612 together form the upper electrode 615 for the capacitor structure 650. In one embodiment, the upper electrode 615 has a thickness between about 200 Å and about 2500 Å, preferably less than about 1000 Å.

In yet another embodiment, the upper electrode 615 may be formed from a titanium nitride (TiN) layer. A TiN layer may be deposited by PVD or CVD using different precursor and reactant gases and process parameters that are known in the art. For example, TiN may be formed from a reaction between titanium tetrachloride ($TiCl_4$) and ammonia ($NH_3$), or metalorganic precursor such as tetrakis-alkylamino titanium, e.g., tetrakis-dimethylamino titanium (TDMAT), tetrakis-diethylamino titanium (TDEAT), among others. A TxZ CVD chamber, available from Applied Materials, Inc., of Santa Clara, Calif., may be used for forming a CVD TiN layer as the upper electrode.

It is understood that the particular method and apparatus used for deposition of the materials of the capacitor is not limiting of the invention. Thus, the invention contemplates performing the annealing and treatment of the ruthenium electrodes in plasma environments which may be remotely generated by a microwave generator, for example. In other embodiments, the plasma is inductively coupled and maintained by RF coils disposed in the processing region of a chamber. Additionally, the substrate heating may be accomplished using lamps, heating elements disposed in a substrate support member and the like. The process parameters may further be adjusted to provide a conducting oxygen-containing layer of the desired thickness.

Table I provides some exemplary parameter ranges suitable for the formation of a MIM stack capacitor according to embodiments of the invention.

TABLE I

| Process Step | Parameter Name | Parameter Range | Preferred Parameter Value |
|---|---|---|---|
| Bottom electrode deposition (metal) | Thickness | 100–2000 Å | 300–1000 Å |
| | Deposition Technique | All deposition techniques, including 2-step with 2 techniques (e.g., PVD seed for CVD "bulk" film) | PVD or CVD |
| | Deposition ambient | Inert or oxygen-containing environment | Inert (argon) |
| | Material | Ru, Ir, Pt. | Ru |
| Bottom electrode anneal | Time | Few seconds (~15 sec.) to several minutes (~10 min.) | 2 minutes |
| | Temperature | 200° C. to 800° C. | 450° C. |
| | Pressure | Few milliTorr to 1 atm. | 2.5 Torr |
| | Ambient | Inert/oxygen mixture, 100% oxygen | 4:1:0.1 $Ar:O_2:N_2$ |
| | Radical generation | All techniques both remote and direct, as well as no radical generation | Remote plasma |
| | Chamber type | PVD, CVD, RTP, xZ RPA, any chamber in which a plasma can be generated or to which a remote plasma generator can be attached. | xZ RPA (modified CVD chamber) |
| Insulator deposition | Thickness | 50 Å to 1000 Å | ~100 Å |
| | Material | $Ta_2O_5$, BST, PZT, SBT, SRO, HfO, ZnO, ZrO, CeO; generally, high-K dielectrics comprising binary metal oxides and perovskite oxides. | $Ta_2O_5$ |
| | Deposition technique | All deposition techniques | CVD |
| | Temperature | Up to about 700° C. | 450° C. |
| | Ambient | Oxidizing | Oxidizing |
| Insulator anneal | Temperature | 300° C. to 800° C. | 350° C. to 550° C. |
| | Time | Few seconds (~15 sec.) to several minutes (~10 min.) | 2 minutes to multi-anneal total of 6 minutes |
| | Ambient | Inert, inert/oxygen mixture, 100% oxygen | Inert, inert/oxygen mixture, 100% oxygen |
| | Pressure | Few Torr to 1 atm. | 1 atm. |
| | Radical generation | All techniques, both remote and direct, as well as no radical generation | Remote plasma- e.g., microwave |
| | Chamber type | CVD, RTP, xZ RPA, any chamber in which a plasma can be generated or to which a remote plasma generator can be attached | RTP |
| Top electrode deposition: | | | |
| First Embodiment | | SAME AS BOTTOM ELECTRODE DEPOSITION | |
| Second embodiment | Thickness | 100–2000 Å | 300–1000 Å |
| | Deposition Technique | All deposition techniques, including 2-step with 2 techniques (PVD seed for CVD "bulk" film) | PVD or CVD |
| | Deposition ambient | Inert or oxygen-containing environment | Inert (argon) |
| | Material | Ru, Ir, Pt | Ru |

TABLE I-continued

| Process Step | Parameter Name | Parameter Range | Preferred Parameter Value |
|---|---|---|---|
| Top electrode anneal: | | | |
| First Embodiment | SAME AS BOTTOM ELECTRODE ANNEAL | | |
| Second embodiment | Time | Few seconds (~15 sec.) to several minutes (~10 min.) | 2 minutes |
| | Temperature | 200° C. to 800° C. | 450° C. |
| | Pressure | Few milliTorr to 1 atm. | 2.5 Torr |
| | Ambient | Inert/oxygen mixture, 100% oxygen | 4:1:0.1 Ar:$O_2$:$N_2$ |
| | Radical generation | All techniques both remote and direct, as well as no radical generation | Remote plasma, e.g., microwave |
| | Chamber type | PVD, CVD, RTP, xZ RPA, any chamber in which a plasma can be generated or to which a remote plasma generator can be attached. | xZ RPA (modified CVD chamber) |

Example from a Conventional Process

Figure 7:
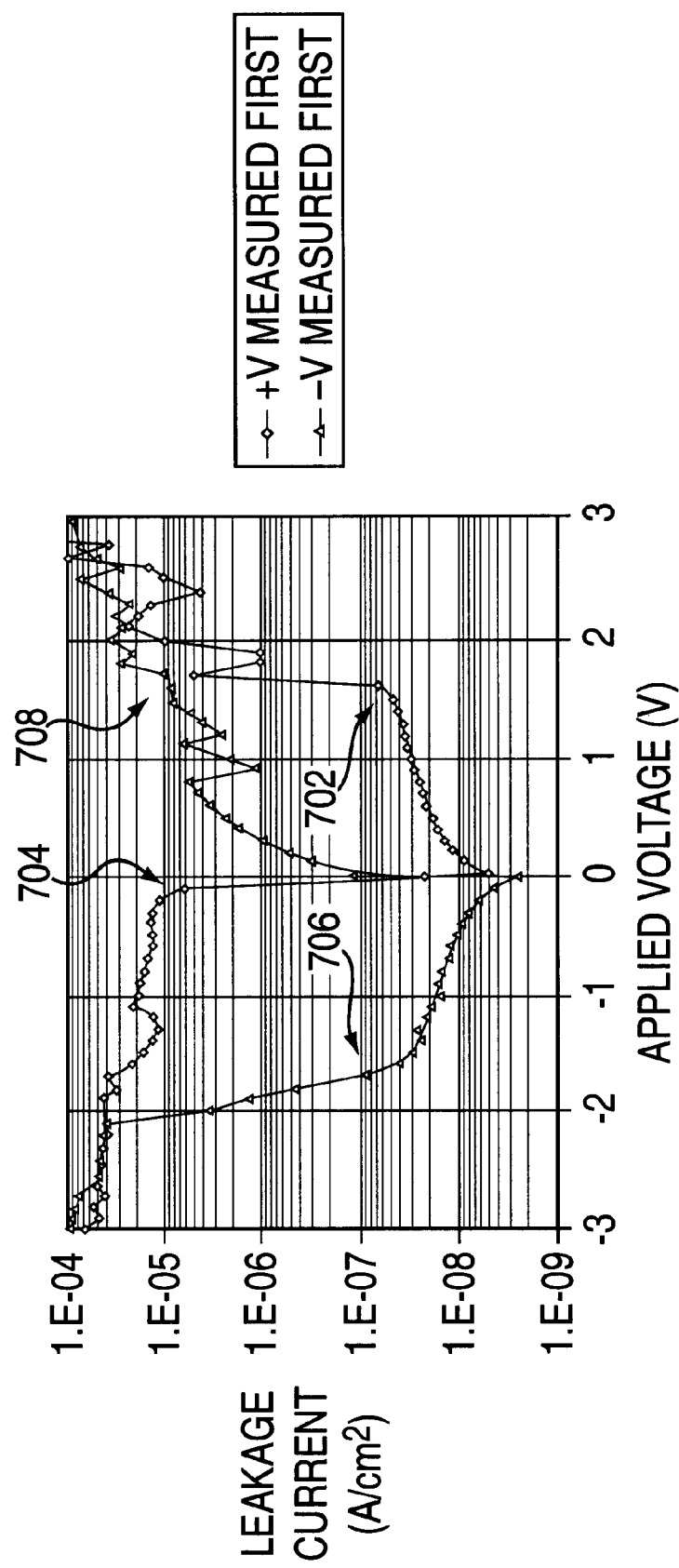
FIG. 7 is a graphical representation of the leakage current and voltage of a capacitor.

A capacitor was produced having a ruthenium bottom electrode, a $Ta_2O_5$ insulating layer and a ruthenium top electrode according to a conventional process. The leakage current and breakdown voltage of the capacitor were measured and recorded. The data was plotted in FIG. 7 as curves 702, 704, 706, 708. When the positive electrode (V+) was measured first, the capacitor exhibited a sharp increase in leakage at about 1.0E-07 A/$cm^2$ as indicated by curve 702. A subsequent measurement taken on the negative electrode indicated that an irreversible breakdown had occurred, as represented by the large initial slope of curve 704. When the negative voltage (V−) was measured first, the capacitor exhibited a sharp increase in leakage at between about 1.0E -08 A/$cm^2$ and 1.0E -07 A/$cm^2$ as indicated by curve 706. A subsequent measurement taken on the positive electrode again indicated that an irreversible breakdown had occurred, as represented by curve 708. Thus, the capacitor was not sufficiently robust and was prone to breakdown at low voltages.

COMPARATIVE EXAMPLE

Figure 8:
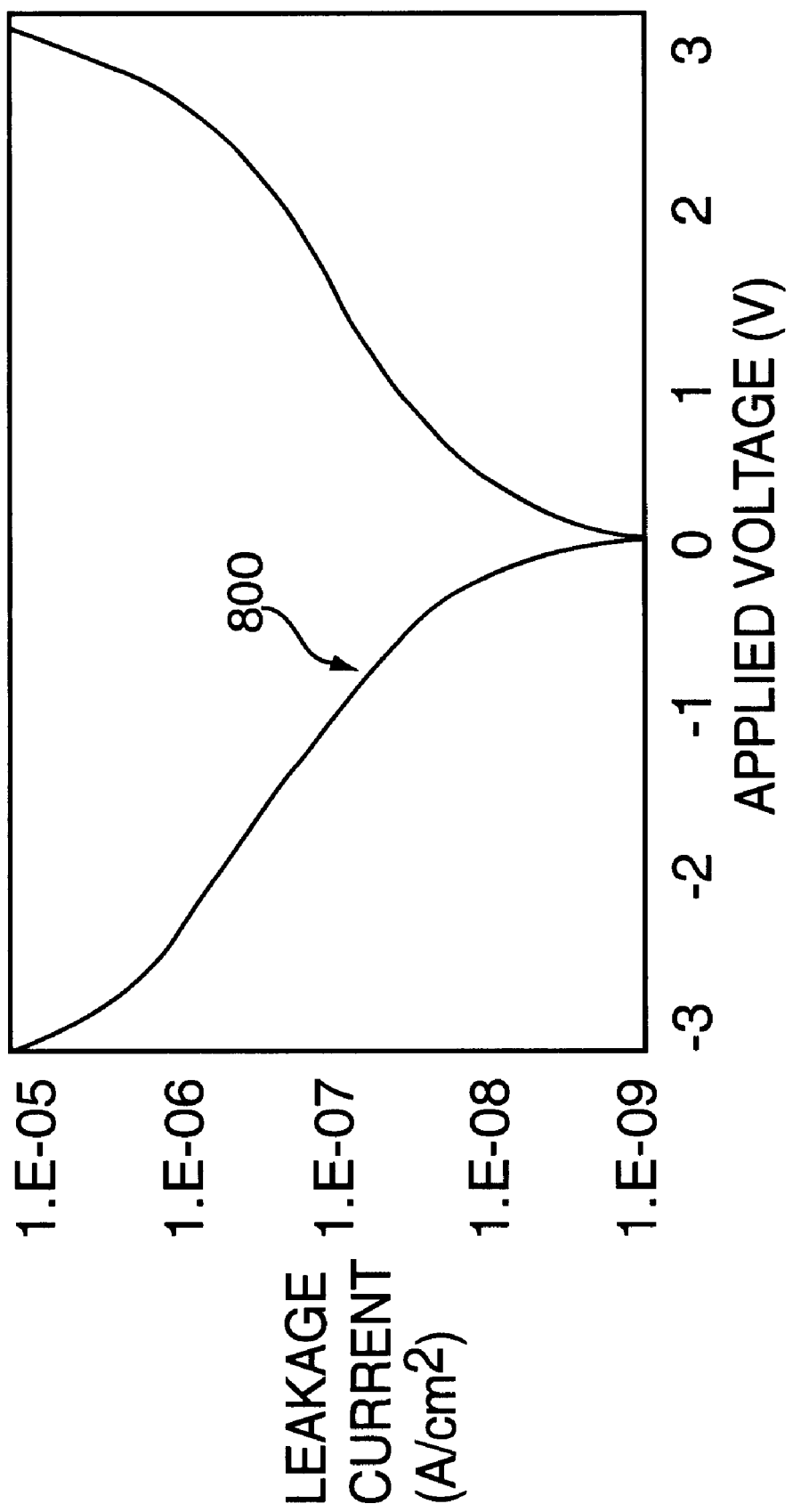
FIG. 8 is a graphical representation of the leakage current and voltage of a capacitor.

The steps recited in the example above were repeated. In addition, prior to deposition of the $Ta_2O_5$ insulator, the ruthenium lower electrode was exposed to an oxygen-containing environment. Values for the leakage current and the voltage were measured and are illustrated in FIG. 8. As shown by curve 800, the capacitor exhibits reproducible results in the positive and negative regions, regardless of which is measured first.

It is believed that the treatment or annealing steps form a conducting oxygen-containing layer respectively at the interfaces between the upper metal layer and the insulator and between the insulator and the lower metal layer. Accordingly, the oxygen-containing layers serve a barrier function, preventing migration of atoms/molecules between the insulator and the metal layers. For example, the oxygen-containing layers are believed to inhibit the metal layers from scavenging for oxygen in nearby regions of the capacitor, e.g., the insulating layer. As a result, the integrity of the insulator was maintained and the capacitor exhibited reduced leakage and increased breakdown voltages.

Capacitive Memory Cell Fabrication

FIGS. 9a–g illustrate schematic cross-sectional views of a substrate 900 at different stages of a capacitive memory cell fabrication sequence according to embodiments of the invention. Depending on the specific stage of processing, the substrate 900 may correspond to a silicon wafer, or other material layer that has been formed on the silicon wafer. Alternatively, the substrate may have integrated circuit structures (not shown) such as logic gates formed on regions thereof.

Figure 9A:
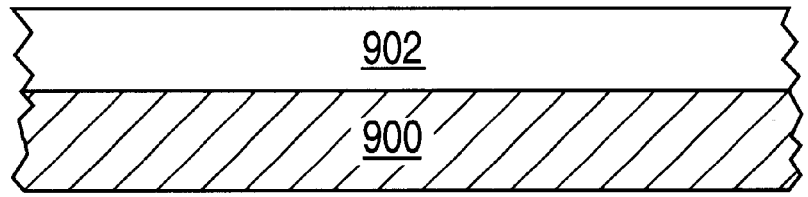
FIGS. 9a–h illustrate partial sectional views of a substrate at different stages of a capacitive memory cell fabrication.

FIG. 9a, for example, illustrates a partial sectional view of a silicon substrate 900 having a material layer 902 formed thereon. The material layer 902 may be an oxide, e.g., fluorosilicate glass (FSG), undoped silicate glass (USG), organosilicates, or a silicon carbide material. The material layer 902 preferably has a low dielectric constant (e.g., dielectric constant less than about 5). The thickness of the material layer 902 may be varied, depending on the size of the structure to be fabricated. For example, the material layer 902 may have a thickness between about 1,000 Å and about 20,000 Å.

Figure 9B:
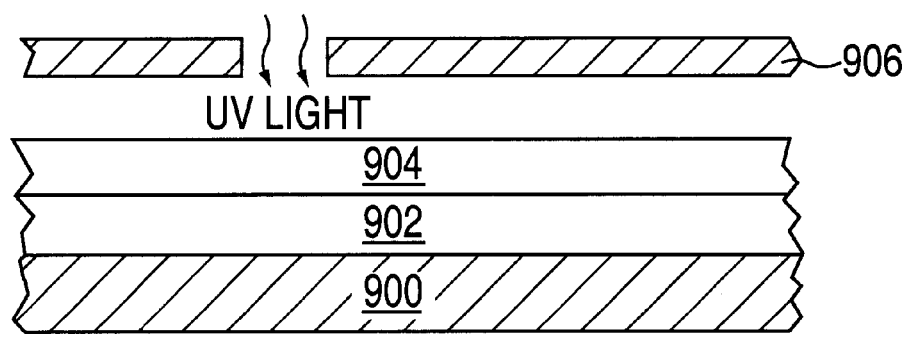

Referring to FIG. 9b, a layer of energy sensitive resist material 904 is formed on the material layer 902. The layer of energy sensitive resist material 904 can be spin-coated on the substrate to a thickness in a range of about 4,000 Å to about 10,000 Å. Most energy sensitive resist materials are sensitive to ultraviolet (UV) radiation having a wavelength less than about 500 nm (nanometers). Deep ultraviolet (DUV) resist materials are sensitive to UV radiation having wavelengths less than about 250 nm.

Figure 9C:
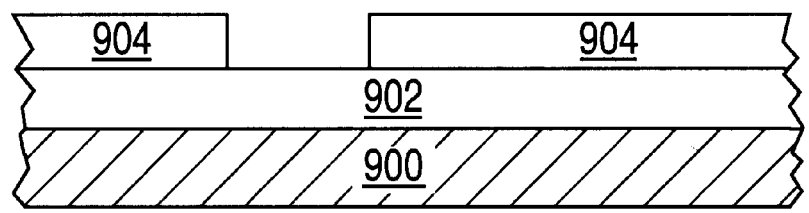
Figure 9D:
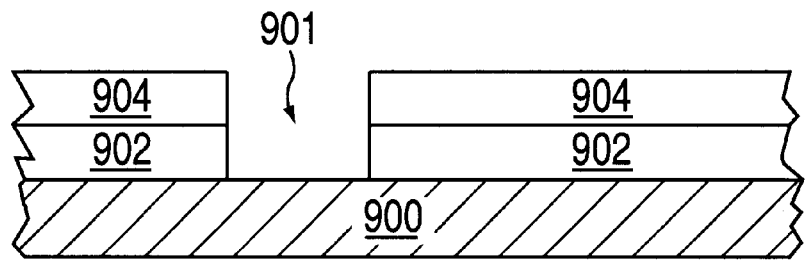

An image of a pattern is introduced into the layer of energy sensitive resist material 904 by exposing such energy sensitive resist material to UV radiation via a mask 906. The image of the pattern introduced into the layer of energy sensitive resist material 904 is developed in an appropriate developer to define the pattern therethrough, as shown in FIG. 9c. Thereafter, referring to FIG. 9d, the pattern defined in the energy sensitive resist material 904 is transferred through the material layer 902 to form apertures 901 therein, using the energy sensitive resist material 904 as a mask. The pattern transfer through the material layer 902 is accomplished by an appropriate chemical etchant.

The apertures 901 may have widths less than about 0.5 $\mu$m (micrometer) wide and depths of about 0.5 $\mu$m to about 2 $\mu$m, providing structures having aspect ratios in a range of about 1:1 to about 4:1.

Figure 9E:
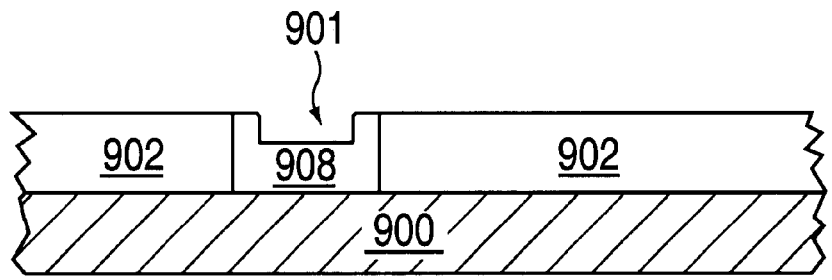

Referring to FIG. 9e, a bottom metal layer 908, e.g., a Ru layer, is formed along the sidewalls and bottom surface of the aperture 901. The bottom Ru layer 908 may be formed using PVD and/or CVD techniques according to process parameters described above. As previously discussed, if the bottom Ru layer 908 is to be deposited by CVD, then a seed layer (not shown) should first be formed inside the aperture 901. To provide an effective seed layer for a CVD Ru electrode, a layer of RuOx (x varies from 0 to about 2) is first formed, followed by appropriate annealing to reduce its oxygen content. After the formation and annealing of the seed layer for CVD Ru, a bottom Ru layer 908 is deposited on the seed layer. If the bottom Ru layer is formed by PVD, then a seed layer may not be necessary. The thickness of the bottom Ru layer 908 is variable depending on the size of the structure to be fabricated. For example, the bottom Ru layer 908 may have a thickness of about 1,000 Å to about 10,000 Å.

Figure 9F:
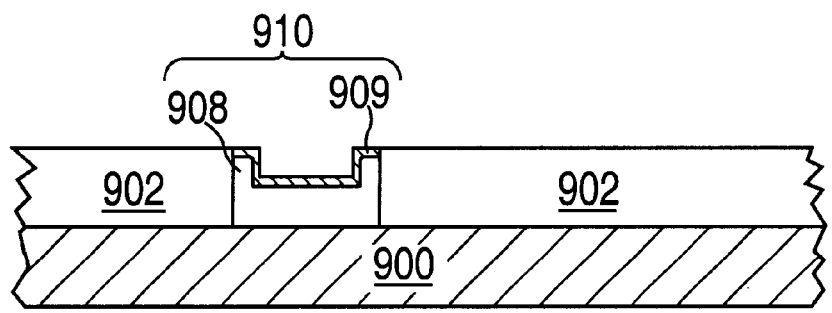

As shown in FIG. 9f, an oxygen-containing Ru layer 909 is formed on the bottom Ru layer 908. The oxygen-containing Ru layer 909 may be formed, for example, by subjecting the bottom Ru layer 908 to a film treatment under plasma and/or thermal conditions as previously discussed. For example, an elevated temperature between about 200°

C. and about 800° C. may be used. Optionally, radical species may be generated in a plasma (e.g., a direct or remote plasma) from an oxygen-containing gas for treating the bottom Ru layer 908. After treatment, oxygen is incorporated into at least a portion of the bottom Ru layer 908 to form the oxygen-containing Ru layer 909. The oxygen-containing Ru layer 909 and the remaining bottom Ru layer 908 together form a bottom Ru electrode 910 of a capacitive memory cell.

The bottom Ru electrode 910 is subsequently patterned and etched to remove unwanted electrode materials from the substrate 900. The Ru bottom electrode 910 is patterned using conventional lithography, as described above with reference to FIGS. 9b–d, and may be etched using oxygen/chlorine-based plasmas.

Figure 9G:
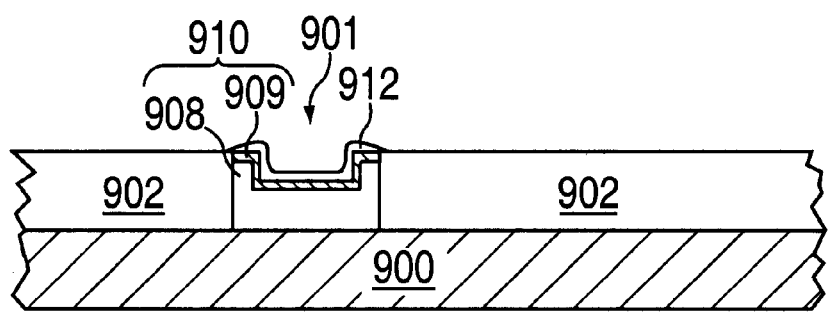

After the bottom Ru electrode 910 is formed in the aperture 901 and patterned, a $Ta_2O_5$ memory cell dielectric layer 912 is deposited thereon, as shown in FIG. 9g. The $Ta_2O_5$ memory cell dielectric layer 912 may be conformally deposited using CVD techniques according to process parameters described above. The thickness of the $Ta_2O_5$ memory cell dielectric layer 912 may be varied, depending on the size of the structure to be fabricated. For example, the $Ta_2O_5$ memory cell dielectric layer 912 may have a thickness of about 100 Å to about 500 Å.

The $Ta_2O_5$ memory cell dielectric layer 912 may optionally be annealed under plasma and/or thermal conditions, according to parameters previously disclosed.

Subsequently, the $Ta_2O_5$ memory cell dielectric 912 is patterned and etched to remove unwanted dielectric material from the substrate 900. The $Ta_2O_5$ dielectric material is patterned using conventional lithography, as described above with reference to FIGS. 9b–d, and may be etched using a chlorine-based compound such as tantalum pentachloride ($TaCl_5$).

Figure 9H:
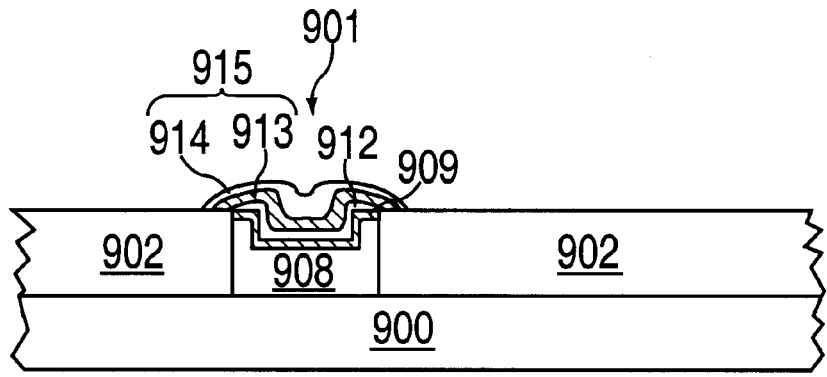

Referring to FIG. 9h, the capacitive memory cell is completed by forming a Ru top electrode 915 on the patterned $Ta_2O_5$ memory cell dielectric layer 912. As previously described, the Ru top electrode 915 is formed in several stages. The Ru top electrode 915 preferably comprises an oxygen-containing Ru layer 913 and a subsequently deposited (second) Ru metal layer 914. The oxygen-containing Ru layer 913 is formed by first depositing a first Ru layer (not shown) on the insulator layer 912, followed by an annealing in an oxygen-containing ambient. The annealing is preferably performed so that oxygen is incorporated substantially into the entire first Ru layer. The second Ru metal layer 914 is then deposited, e.g., by CVD or PVD, on the oxygen-containing Ru layer 913 according to process parameters described above.

The oxygen-containing Ru layer 913 and the second Ru layer 914 together constitute the Ru top electrode 915. The thickness of the Ru top electrode 915 may vary, depending on the size of the structure to be fabricated. For example, the Ru top electrode 915 may have a thickness of about 1,000 Å to about 10,000 Å.

Optionally, the Ru top electrode 915 may be annealed under plasma and/or thermal conditions, using parameter ranges previously disclosed.

The Ru top electrode 915 is optionally patterned and etched to remove unwanted electrode material from the substrate 900. The Ru top electrode 915 is patterned using conventional lithography, as described above with reference to FIGS. 9b–d, and may be etched using oxygen/chlorine-based plasmas.

While the foregoing is directed to preferred embodiments of the present invention, other and further embodiments of the invention may be devised without departing from the basic scope thereof, and the scope thereof is determined by the claims that follow.

What is claimed is:

1. A method of forming a device on a substrate, comprising:
    (a) forming a first metal layer on a substrate, wherein the first metal layer is formed by depositing a first metal-containing seed layer, treating the first metal-containing seed layer to reduce the oxygen content therein, and depositing a first metal bulk layer on the treated first metal-seed layer;
    (b) exposing the first metal layer to a first oxygen-containing environment to form a first conducting oxygen-containing layer;
    (c) forming an insulator on the first conducting oxygen-containing layer;
    (d) forming a second metal layer on the insulator;
    (e) exposing the second metal layer to a second oxygen-containing environment to form a second conducting oxygen-containing layer; and
    (f) forming a third metal layer on the second conducting oxygen-containing layer.

2. The method of claim 1, wherein (a) comprises depositing ruthenium.

3. The method of claim 1, wherein (a), (d) and (f) comprise depositing ruthenium.

4. The method of claim 1, wherein (a) comprises depositing ruthenium and (b) comprises exposing the first metal layer to an oxygen-containing gas and heating the substrate.

5. The method of claim 1, wherein (c) comprises forming a tantalum pentoxide ($Ta_2O_5$) layer.

6. The method of claim 1, wherein (c) comprises depositing a material having a dielectric constant greater than about 20.

7. The method of claim 1, wherein (a), (d) and (f) comprise depositing ruthenium, (b) comprises exposing the first metal layer to an oxygen-containing gas, (c) comprises forming a tantalum pentoxide ($Ta_2 O_5$) layer, and (e) comprises exposing the second metal layer to an oxygen-containing gas.

8. The method of claim 7, wherein the oxygen-containing gas is selected from a group comprising nitrous oxide ($N_2O$), oxygen ($O_2$) and combinations thereof.

9. A method of forming a device on a substrate, comprising:
    (a) depositing a first ruthenium layer on the substrate, wherein the first ruthenium layer is deposited by forming a ruthenium-containing seed layer and thereafter forming a ruthenium layer on the ruthenium-containing seed layer by chemical vapor deposition, and wherein the ruthenium-containing seed layer further comprises oxygen, and prior to depositing the ruthenium layer thereon, the ruthenium-containing seed layer is subjected to a treatment step for reducing the oxygen content therein;
    (b) heating the substrate;
    (c) exposing the first ruthenium layer to an oxygen-containing gas;
    (d) depositing an insulating material;
    (e) depositing the first metal layer on the insulating material;
    (f) exposing the first metal layer to an oxygen-containing gas; and
    (g) after (f), depositing a second metal layer.

10. The method of claim 9, at least one of (e) and (g) comprise depositing ruthenium.

11. The method of claim 9, wherein (c) and (f) comprise forming a conducting oxygen-containing layer.

12. The method of claim 9, wherein (d) comprises depositing a tantalum pentoxide ($Ta_2O_5$) layer.

13. The method of claim 12, wherein (d) further comprises annealing the tantalum pentoxide layer.

14. The method of claim 9, wherein (b) comprises heating the substrate to a temperature between about 200° C and about 900°C.

15. The method of claim 9, wherein (b) comprises heating the substrate to a temperature between about 200° C and about 900°C, (d) comprises depositing a $Ta_2O_5$ layer, and (e) comprises depositing a second ruthenium layer.

16. A method of forming a memory cell, comprising
 (a) forming a first electrode on a substrate,
 (b) forming a dielectric layer on the first electrode; and
 (c) forming a second electrode on the dielectric layer;
 wherein at least one of the first electrode and the second electrode comprises a metal layer and a conductive oxygen-containing layer, wherein the conductive oxygen-containing layer is adjacent to the dielectric layer, and wherein the metal layer is formed by depositing a metal-containing seed layer, treating the metal-containing seed layer in an environment to reduce the oxygen content thereof and depositing a bulk metal layer on the treated metal-containing seed layer using a chemical vapor deposition process.

17. The method of claim 16, wherein the metal layer comprises ruthenium.

18. The method of claim 16, wherein the metal layer is a ruthenium layer and the conductive oxygen-containing layer is an oxygen-containing ruthenium layer.

19. The method of claim 16, wherein the first electrode comprises a metal selected from the group consisting of ruthenium, iridium and platinum.

20. The method of claim 16, wherein the metal-containing seed layer is treated in the presence of a plasma.

21. The method of claim 16, wherein the second electrode is selected from the group consisting of ruthenium, iridium, platinum and titanium nitride.

22. The method of claim 16, wherein the dielectric material is tantalum pentoxide.

23. The method of claim 16, further comprising, prior to (c), treating the dielectric material in an oxygen-containing environment.

24. A computer storage medium containing a software routine that, when executed, causes a genera purpose computer to control a deposition chamber using a method of thing film deposition, comprising:
 (a) forming a first metal layer on a substrate, wherein the first metal layer is formed by depositing a first metal-containing seed layer, treating the first metal-containing seed layer to reduce the oxygen content therein, and depositing a first metal bulk layer on the treated first metal-seed layer;
 (b) exposing the first metal layer to a first oxygen-containing environment to form a first conducting oxygen-containing layer'
 (c) forming an insulator on the first conducting oxygen-containing layer;
 (d) forming a second metal layer on the insulator;
 (e) exposing the second metal layer to a second oxygen-containing environment to form a second conducting oxygen-containing layer; and
 (f) forming a third metal layer on the second conducting oxygen-containing layer.

25. A method of forming a device on a substrate, comprising:
 (a) depositing a first ruthenium layer on the substrate, wherein the first ruthenium layer is deposited by forming a ruthenium-containing seed layer and thereafter forming a ruthenium layer on the ruthenium-containing seed layer by chemical vapor deposition;
 (b) heating the substrate;
 (c) exposing the first ruthenium layer to an oxygen-containing gas;
 (d) depositing an insulating material;
 (e) depositing the first metal on the insulating material;
 (f) exposing the first metal layer to an oxygen-containing gas; and
 (g) after (f), depositing a second layer.

26. A method of forming a memory cell, comprising:
 (a) forming a first electrode on a substrate,
 (b) forming a dielectric layer on the first electrode; and
 (c) forming a second electrode on the dielectric layer;
 wherein at least one of the first electrode and the second electrode comprises a metal layer and a conductive oxygen-containing layer; and
 wherein the first electrode is formed by:
  forming a ruthenium-containing seed layer;
  treating the ruthenium-containing seed layer in an oxygen-containing environment; and
  forming a ruthenium layer on the treated ruthenium-containing seed layer by chemical vapor deposition.

27. The method of claim 26, wherein treating the ruthenium-containing seed layer in an oxygen-containing environment is performed in the presence of a plasma.

* * * * *

UNITED STATES PATENT AND TRADEMARK OFFICE
CERTIFICATE OF CORRECTION

PATENT NO. : 6,475,854 B2
DATED : November 5, 2002
INVENTOR(S) : Pravin K. Narwankar et al.

It is certified that error appears in the above-identified patent and that said Letters Patent is hereby corrected as shown below:

Column 5,
Line 22, please delete "A5".

Column 9,
Line 2, please change "deposiiton" to -- deposition --.
Line 17, please change "RuO" to -- $RuO_x$ --.

Column 10,
Line 27, please change "odixe" to -- oxide --.

Column 16,
Line 63, please change "the first" to -- a first --.

Column 17,
Line 49, please change "genera" to -- general --.
Line 51, please change "thing" to -- thin --.

Column 18,
Line 7, please change "layer" to -- layer; --.

Signed and Sealed this

Eleventh Day of March, 2003

JAMES E. ROGAN
*Director of the United States Patent and Trademark Office*